United States Patent
Keul

(10) Patent No.: US 9,736,955 B2
(45) Date of Patent: Aug. 15, 2017

(54) CIRCUITRY ON PRINTED CIRCUIT BOARDS IN A PLURALITY OF PLANES, HAVING AN INTERFACE FOR A PLUG-IN BOARD

(71) Applicant: ABB Schweiz AG, Baden (CH)

(72) Inventor: Thomas Keul, Freigericht (DE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/216,727

(22) Filed: Jul. 22, 2016

(65) Prior Publication Data
US 2017/0027071 A1    Jan. 26, 2017

(30) Foreign Application Priority Data
Jul. 23, 2015 (DE) .......................... 10 2015 111 972

(51) Int. Cl.
*H01R 12/71* (2011.01)
*H05K 1/14* (2006.01)
(Continued)

(52) U.S. Cl.
CPC ........... *H05K 5/0286* (2013.01); *H05K 1/117* (2013.01); *H05K 1/141* (2013.01); *H05K 1/145* (2013.01); *H05K 3/366* (2013.01); *H05K 5/0069* (2013.01); *H01R 12/716* (2013.01); *H01R 12/737* (2013.01); *H05K 1/02* (2013.01); *H05K 1/144* (2013.01); *H05K 2201/09063* (2013.01);
(Continued)

(58) Field of Classification Search
None
See application file for complete search history.

(56) References Cited

U.S. PATENT DOCUMENTS 4,551,673 A * 11/1985 Barth ................. G01R 1/07378
324/756.05
5,269,693 A   12/1993 Sekine
(Continued)

FOREIGN PATENT DOCUMENTS

DE        4242320 C1    4/1994
DE   102007060429 A1    6/2009

OTHER PUBLICATIONS

"Preventing the Simultaneous Attachment pf a Card and Cable to a Circuit Board", IBM Technical Disclosure Bulletin, International Business Machines Corp. (Thornwood), US, Bd. 40, Nr. 10, Oct. 1, 1997 (Oct. 1, 1997), pp. 203-205, XP000739477.

*Primary Examiner* — Xanthia C Cunningham
(74) *Attorney, Agent, or Firm* — Leydig, Voit & Mayer, Ltd.

(57) ABSTRACT

An electronic circuit has at least one first printed circuit board extending in a first plane, and at least one second printed circuit board extending in a second plane that extends in parallel to, and outside of, the first plane, and also has at least one first connector device, in electrical contact with the first printed circuit board, and a second connector device, in electrical contact with the second printed circuit board and arranged on a second printed circuit board side facing away from the first printed circuit board, both connector devices being designed together to receive an associated plug-in board and to electrically contact this plug-in board using both printed circuit boards, the first connector device being arranged, at least in part, on a second plane side facing away from the first printed circuit board.

13 Claims, 3 Drawing Sheets

(51) Int. Cl.
   *H05K 5/02* (2006.01)
   *H05K 3/36* (2006.01)
   *H05K 1/11* (2006.01)
   *H05K 5/00* (2006.01)
   *H01R 12/73* (2011.01)
   *H05K 1/02* (2006.01)

(52) U.S. Cl.
   CPC .............. *H05K 2201/10189* (2013.01); *H05K 2201/10522* (2013.01); *H05K 2201/10962* (2013.01)

(56) References Cited

U.S. PATENT DOCUMENTS

| | | | |
|---|---|---|---|
| 6,390,831 B2 * | 5/2002 | Shimada | H04Q 1/10 439/74 |
| 8,363,418 B2 * | 1/2013 | Johnson | G06F 1/32 174/255 |
| 9,320,168 B2 * | 4/2016 | Drew | H05K 7/1427 |
| 2005/0195583 A1 * | 9/2005 | AbuGhazaleh | H05K 1/0228 361/780 |
| 2006/0067066 A1 * | 3/2006 | Meier | G06F 1/184 361/785 |
| 2007/0184676 A1 | 8/2007 | Minich | |
| 2008/0139010 A1 * | 6/2008 | Havermann | H01R 13/6456 439/64 |
| 2008/0247751 A1 * | 10/2008 | Lang | G03B 17/00 396/542 |
| 2009/0147492 A1 * | 6/2009 | Heinrichs | G06F 1/185 361/784 |

* cited by examiner

CIRCUITRY ON PRINTED CIRCUIT BOARDS IN A PLURALITY OF PLANES, HAVING AN INTERFACE FOR A PLUG-IN BOARD

CROSS-REFERENCE TO RELATED APPLICATIONS

Priority is claimed to German Patent Application No. DE 10 2015 111 972.2, filed on Jul. 23, 2015, the entire disclosure of which is hereby incorporated by reference herein.

FIELD

The invention relates to electronic circuits which are divided into a plurality of planes on printed circuit boards and contain additional plug-in boards.

BACKGROUND

In order to be able to construct devices in industrial electronics more compactly, a plurality of printed circuit boards, which are equipped with components in two dimensions, are arranged on top of one another in a plurality of planes, and so the components that are present on all of the printed circuit boards collectively form one electronic circuit. Such circuits often contain plug-in boards, which can be inserted into connector devices on the printed circuit boards using an edge connector and can be electrically contacted by both printed circuit boards in this manner. Assemblies are often put together on plug-in boards when the intention is for them to be added to the circuit subsequently by the user or to be replaced during operation. Plug-in boards therefore contain in particular expansion modules for retrofitting additional functionalities or capacities, memory modules or wearing parts, which will probably be replaced during the service life of the device.

Edge connectors and the associated connector devices, which collectively form a "card edge" connector, are available in many sizes, structural shapes and having many numbers of contacts, each of which are standardized. If one plug-in board is to be in contact simultaneously with two printed circuit boards arranged on top of one another, a height difference between the planes, in which these two printed circuit boards extend, has to be bridged. Using the existing standardized connector devices, this can currently only be achieved by the part of the plug-in board having the edge connector, which is to engage in the connector device on the lower printed circuit board, projecting by the amount of the difference in height beyond the edge connector, which is to engage in the connector device on the higher printed circuit board. The plug-in board therefore needs a stepped edge if its edge connector is to engage in connector devices on both printed circuit boards simultaneously.

In industrial electronics it is often necessary to encapsulate plug-in boards in module housings to protect them from mechanical damage. In so doing, this presents problems if a plug-in board has a stepped edge.

SUMMARY

An aspect of the invention provides an electronic circuit, comprising: a first printed circuit board, which extends in a first plane; a second printed circuit board, which extends in a second plane, the second plane being parallel to the first plane and being outside of the first plane; a first connector device, which is in electrical contact with the first printed circuit board; and a second connector device, which is in electrical contact with the second printed circuit board, wherein the second connector device is arranged on a first side of the second printed circuit board facing away from the first printed circuit board, wherein both the first and second connector devices are configured together to receive an associated plug-in board, wherein both of the first and second connector devices are configured together to electrically contact the associated plug-in board using both the first and second printed circuit boards, wherein the first connector device is arranged, at least in part, on a second side of the second plane facing away from the first printed circuit board.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
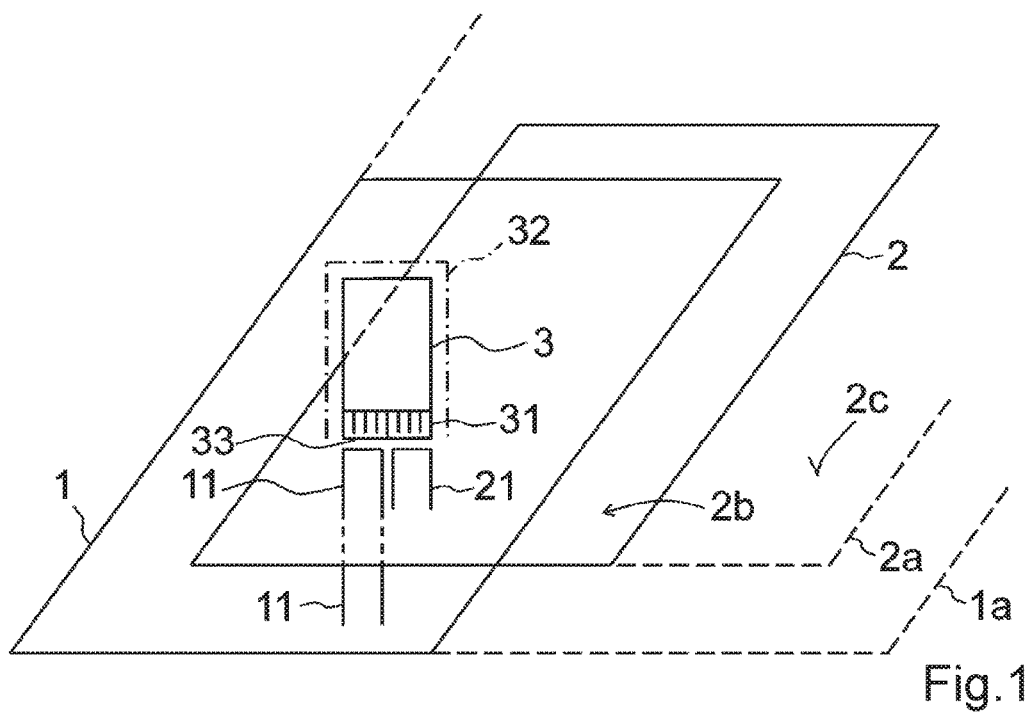
FIG. 1 shows an embodiment of the invention according to the first embodiment.

A problem addressed by the invention is therefore that of providing an electronic circuit with a plurality of printed circuit boards arranged on top of one another, in which both printed circuit boards can be connected to one plug-in card without the height difference between the two printed circuit boards having to be bridged by a stepped edge of the plug-in board.

Within the scope of an aspect of the invention, an electronic circuit was developed. This circuit comprises at least one first printed circuit board, which extends in a first plane, and at least one second printed circuit board, which extends in a second plane that extends parallel to the first plane and outside of said first plane. Depending on the orientation of the circuit relative to Earth's gravitational field, the printed circuit boards and the planes can, for example, be arranged on top of one another but alternatively also next to one another.

Furthermore, the circuit comprises at least one connector device, which is in electrical contact with the first printed circuit board and therefore also with the components included on said first printed circuit board. It also comprises at least one second connector device, which is in electrical contact with at least the second printed circuit board and therefore also with the components included on said second printed circuit board. In the process, this second connector device is arranged on the side of the second printed circuit board facing away from the first printed circuit board. Both connector devices are designed together for receiving an associated plug-in board and for said plug-in board to be in electrical contact with both printed circuit boards.

According to an aspect of the invention, the first connector device is arranged, at least in part, on the side of the second plane facing away from the first printed circuit board.

The known art is therefore modified to the extent that the gap (height difference) between the two printed circuit boards is no longer bridged by an adaptation to the plug-in board, but rather by an adaptation to the first connector device. The plug-in board then no longer has to have a stepped edge. Furthermore, versions of the circuit having different gaps between the printed circuit boards can also be designed such that the dimensions of the two connector devices and their arrangement relative to one another are identical. One plug-in board can then be used in both versions of the circuit. Accordingly, additional costs in production, which would be incurred in the production of a plurality of plug-in cards having the same function and different mechanical dimensions, can be saved.

In particular, the two connector devices can each be designed as the female part of the card edge connector. They can, for example, each comprise contact springs, which produce the electrical contact with contact surfaces on an edge connector of the plug-in board and simultaneously hold the plug-in board in position by means of static friction. In addition, the connector devices can, for example, contain further devices for mechanically stopping an inserted plug-in board, as well as coding which prevents the insertion of an unsuitable plug-in board or a plug-in board having reversed polarity.

Advantageously, the circuit comprises a plug-in board, which is in contact with the two printed circuit boards by means of the two connector devices. The part of the circuit, which comprises the two printed circuit boards having both the associated connector devices and the appropriate plug-in boards, are, however, products, which can also be produced and sold independently of one another. Likewise, the plug-in boards for use in connection with the invention do not necessarily have to be produced from scratch. Instead, the invention also advantageously expands the range of circuits for already-existing plug-in cards in which these can be used.

In a particularly advantageous embodiment of the invention, the first connector device is arranged on the first printed circuit board and is guided through the second printed circuit board. In particular, said connector device can then adjoin the second connector device and/or line up precisely therewith. Both connector devices can then effectively merge into one single connector device, into which an associated edge connector of the plug-in board can be inserted using one straight edge. A first partial quantity of the terminals of the edge connector can then contact the first printed circuit board by means of the first connector device, while a second partial quantity of the terminals on the edge connector is in contact with the second printed circuit board by means of the second connector device.

A plug-in board, which is used in this embodiment, can optionally also be used in a circuit which achieves the same functionality on one single printed circuit board and comprises only one single connector device, which is equivalent to the combination of two connector devices used in the division into two printed circuit boards. Conversely, an existing plug-in board, which has been used until now in a circuit having just one single printed circuit board, can continue to be used without modification if this circuit is later divided onto two printed circuit boards. In this manner, the invention abstracts the interface presented by the edge connector of the plug-in board from the realization and geometric division of the circuit, which is hidden behind this interface.

It is therefore generally advantageous for each of the connector devices to be designed for receiving at least one edge connector of the plug-in board. It is in particular generally advantageous for both connector devices to be designed together to receive one edge connector of the plug-in board. It is generally most preferable for both connector devices to comprise a common stop for a straight edge for one edge connector of the plug-in board.

In order to achieve the first embodiment of the invention described above, only the first connector device is to be modified in respect of the prior art. It may be the case that no suitable first connector device is available in a standard size for a predetermined distance between the two printed circuit boards. Therefore, in a second advantageous embodiment of the invention, the first connector device is arranged on the second printed circuit board and is in electrical contact with the first printed circuit board by means of a line.

The first connector device can then continue to be used according to the standard size used until now without modification. In particular, in exactly the same way as the first embodiment, both connector devices can present themselves collectively relative to the edge connector of the plug-in board as one single connector device. Thus the same advantages are achieved as with the first embodiment. Instead of using a non-standard first connector device, the deviation from the standard is, however, shifted to the line, which connects the first connector device to the first printed circuit board. This can be considerably simpler than producing a non-standard connector device. For example, in many applications of industrial electronics, both circuit boards are connected to a common bus system, which can be used in order to establish the contact between the first connector device and the first printed circuit board.

The two connector devices do not have to be separate components in this embodiment either. They can also be combined into one single connector device from the outset, which is divided merely logically into two connector devices. A first partial quantity of contacts, which are electrically connected to the first printed circuit board, is then associated logically with the first connector device. A second partial quantity of contacts, which are electrically connected to the second printed circuit board, is associated logically with the second connector device. Such a division allows, for example, the contacts and their mating parts on the plug-in board to be grouped according to their function instead of according to the printed circuit board to which they are connected.

In this way, the edge connector of the plug-in card can, for example, have in each case a first set of contacts both for connecting to the first printed circuit board and for connecting to the second printed circuit board, which contacts only have to conduct a relatively low current, for example for transmitting control signals. In addition, a second set of contacts can be provided in each case, which have to conduct a considerably higher current, for example for transferring power to a motorized actuator. Both the production of the plug-in board and the production of the printed circuit boards are simplified, if those contacts in the contact layout on the card edge connector, which only have to conduct a relatively low current, are grouped together in a first associated group and those contacts, which have to conduct a higher current, are grouped together in a second associated group.

The considerable advantages of the invention can be achieved by a third embodiment of the invention without the second printed circuit board having to be modified. In this third embodiment, the first connector device is arranged on the first printed circuit board and guided outside of the second printed circuit board through the second plane. In this embodiment also, the two connector devices can interact such that they merge into one single connector device and hold one edge connector of the plug-in board. The only difference is that there can then be a region between the first connector device and the second connector device in which no contact springs surround the edge connector.

The embodiments can also be combined with one another. For example, a first region of the plug-in board, which is designed as an edge connector, can engage in a first connector device and in a second connector device, which directly adjoin one another in the region of the second printed circuit board. This region of the plug-in board, which is designed as an edge connector, is then in contact with the second printed circuit board and with a first region on the first printed circuit board. In addition, there can also be a second region of the plug-in board, which is designed as an edge connector and engages in a further connector device that is arranged on the first printed circuit board and is guided through the second plane, outside of the second printed circuit board and at some distance away therefrom. In this manner, the plug-in board can also be in contact in parallel with a further region on the first printed circuit board. In this way, for example necessary wiring can be simplified and shortened.

In a particularly advantageous embodiment of the invention, the plug-in board including its edge connector is arranged inside a module housing, which is open or to be opened at the side by means of which the plug-in board can be inserted into the connector devices. Such a module housing protects the plug-in card from mechanical damage. For example, a plurality of plug-in boards can then be stacked in the context of inventory holding without further repackaging. The module housing can be designed so as to be more resilient than the plug-in board itself and, in the event of the plug-in board falling onto the ground, absorbs the majority of the impact energy. The use of a module housing is considerably simplified by omitting the necessity of providing the plug-in board with a stepped edge.

In a further particularly advantageous embodiment of the invention, both printed circuit boards are arranged in a common housing, which comprises means to guide the plug-in board and/or its module housing to produce the electrical contact between the plug-in board and the two connector devices. Guiding the module housing has the advantage that this is less sensitive than the plug-in board itself. If, for example, an attempt is made to use a plug-in card having reversed polarity or in an unsuitable place, corresponding coding on the module housing can withstand greater forces.

Since a distance between the two printed circuit boards according to the invention is easier to bridge, required insulation distances, for example, between the two printed circuit boards can be achieved more easily. In this connection, dividing the electronic circuit onto two printed circuit boards can be used not only to better exploit the space inside the housing, but also to increase operational reliability. For this purpose, in a further particularly advantageous embodiment of the invention, the part of the circuit arranged on the first printed circuit board can at least in a partial region have a greater nominal voltage in terms of amount than the part of the circuit arranged on the second printed circuit board.

For example, the first printed circuit board can contain those components which conduct the mains voltage or other dangerous voltages, while on the second printed circuit board only components which conduct low voltage are arranged. This is then directly visible to the fitter who is carrying out work on the circuit. In particular, the second printed circuit board can cover the partial region which has higher mains voltage in terms of the amount in a touch-proof manner. In this context, "touch-proof" is understood to mean that it is not possible to come into contact with the higher mains voltage using the standard test finger. As long as the second printed circuit board is in position, work on the circuit can then be carried out without special precautionary measures for working under voltage.

FIG. 1 is a schematic, perspective view of an embodiment according to the first embodiment of the invention. The first printed circuit board 1 extends in a first plane 1a, the further extension of which is indicated by the dashed lines. The second printed circuit board 2 extends in a second plane 2a, the extension of which is likewise indicated by dashed lines. On the second printed circuit board 2, a second connector device 21 is arranged, which produces the contact between the plug-in board 3 and the second printed circuit board 2. This connector device 21 is located on the side 2b of the second printed circuit board facing away from the first printed circuit board 1. It is therefore also located on the side 2c of the second plane 2a facing away from the first printed circuit board 1.

The first connector device 11 is now arranged on the first printed circuit board 1 and is guided through the second printed circuit board 2. A partial region of said first connector device 11 therefore projects beyond the side 2b of the printed circuit board 2 facing away from the first printed circuit board 1 and directly adjoins the second connector device 21. The first connector device 11 therefore produces the contact between the plug-in board 3 and the first printed circuit board 1. Because a partial region of the first connector device 11 projects beyond the second printed circuit board 2, this partial region is also automatically arranged on the side 2c of the second plane 2a facing away from the first printed circuit board 1.

The plug-in board 3 has an edge connector 31, which has a straight lower edge 33 and can be inserted using this lower edge 33 simultaneously into both connector devices 11 and 21. Both connector devices 11 and 21 are therefore designed together to receive this one edge connector 31. They also have a common stop for the straight lower edge 33 of this edge connector 31. Both connector devices 11 and 21 therefore present themselves as one single connector device in relation to the edge connector 31.

The plug-in board 3, including the edge connector 31, is arranged inside a module housing 32. This module housing 32 is open at the side by means of which the edge connector 31 of the plug-in board 3 can be inserted into the connector devices 11 and 21.

Figure 2:
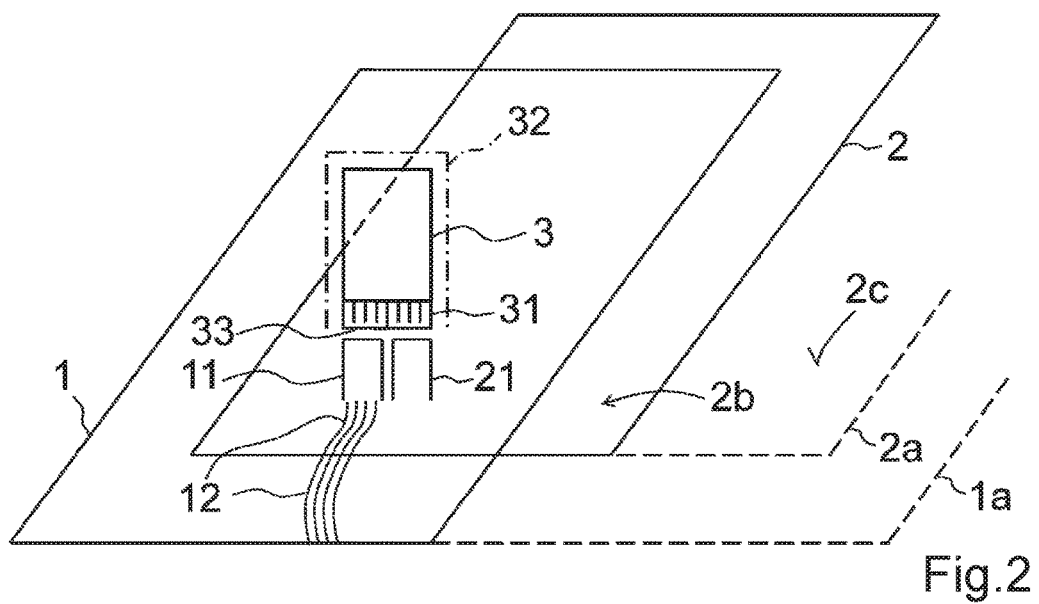
FIG. 2 shows an embodiment of the invention according to the second embodiment.

The embodiment, shown in FIG. 2, according to the second embodiment of the invention is modified relative to the embodiment shown in FIG. 1 to the extent that now the first connector device 11 is also mounted on the second printed circuit board 2. Accordingly, this first connector device 11 has a standard size. The gap between the printed circuit boards 1 and 2 is bridged by the line 12, which connects the first connector device 11 to the first printed circuit board 1. In FIG. 2, this occurs by means of a first partial length in the plane of the second printed circuit board 2 as far as the front edge thereof and by means of a subsequent second partial length downwards to the first printed circuit board 1.

Figure 3:
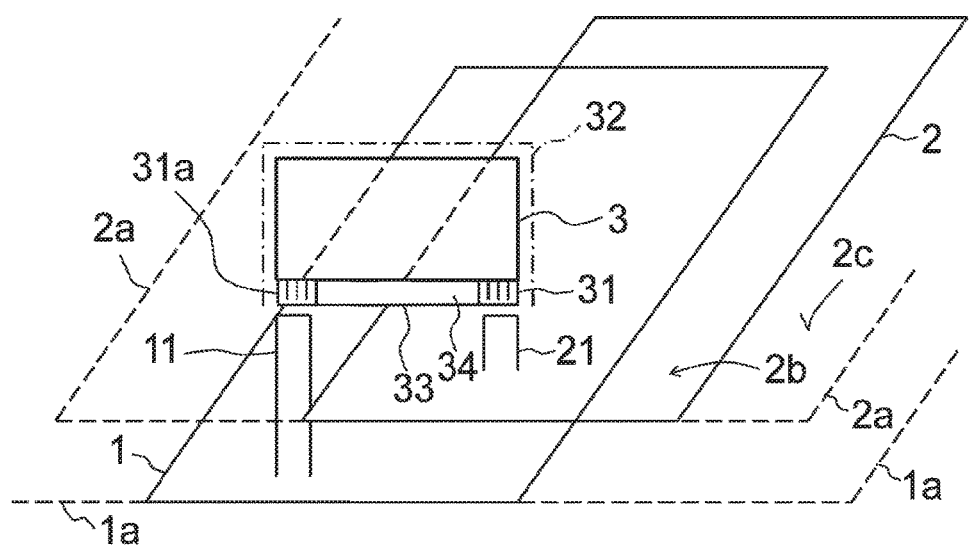
FIG. 3 shows an embodiment of the invention according to the third embodiment.

FIG. 3 shows a further embodiment according to the third embodiment of the invention. This embodiment differs from the embodiment shown in FIG. 1 to the extent that the first connector device 11 is no longer guided through the second printed circuit board 2 but rather is arranged outside the region in which the second printed circuit board 2 extends beyond the first printed circuit board 1. The plug-in board 3 now has two edge connectors 31 and 31a, which engage at the same height in the connector devices 21 and 11 respectively. Both edge connectors 31 and 31a end in a common straight lower edge 33. The region 34 between the edge connectors 31 and 31a can optionally be left out of the straight lower edge 33 of the plug-in board 3. The two edge connectors 31 and 31a can then, still according to the invention, also be better protected by the module housing 32 than according to the available prior art, since this is already seen in that both edge connectors 31 and 31a end in the common straight lower edge 33 and the one edge connector no longer has to project beyond the other edge connector.

This embodiment is advantageous in respect of the embodiment shown in FIG. 1 in that nothing has to be modified on the second printed circuit board 2. When retrofitting an existing circuit, only the former first connector device on the first printed circuit board 1 has to be exchanged for the new first connector device 11.

Figure 4:
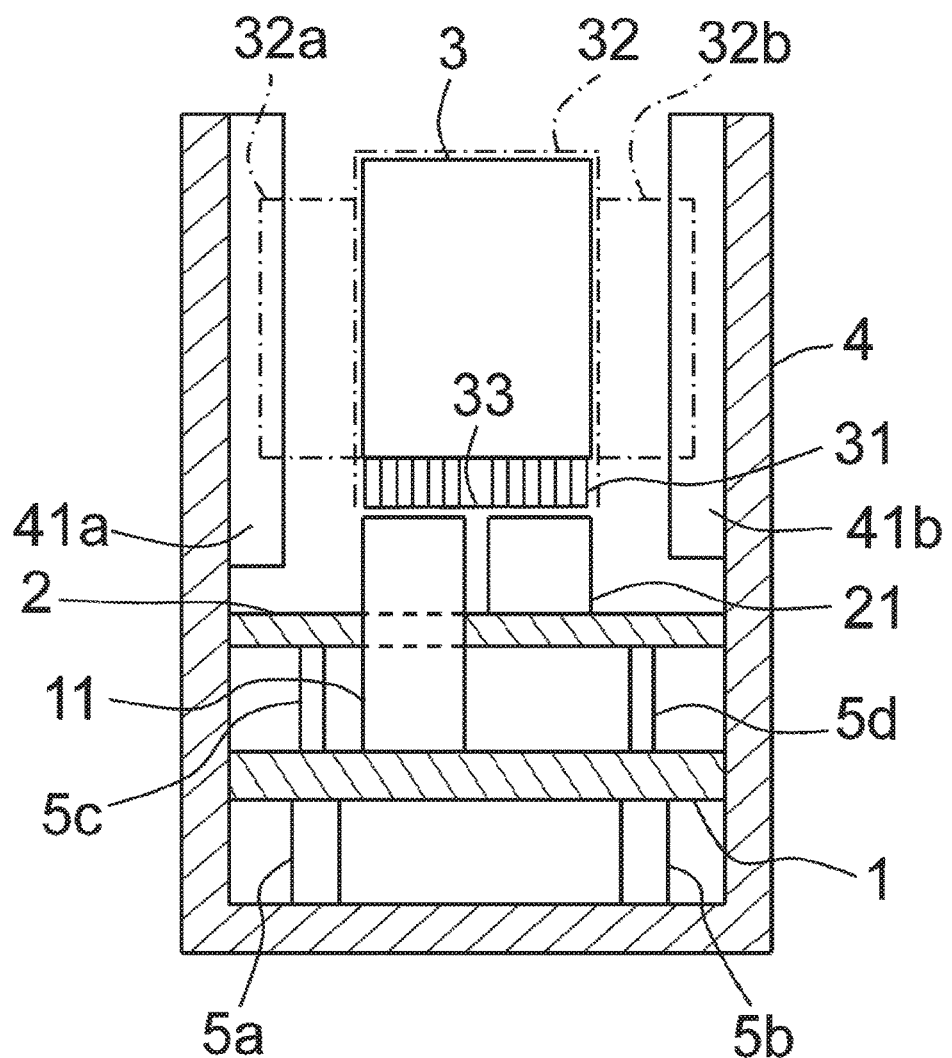
FIG. 4 shows the circuit installed in a housing.

FIG. 4 illustrates the installation of the circuit according to the invention in a housing 4. Inside this housing 4, the first printed circuit board 1 rests on spacers 5a and 5b, which stand on the base of the housing 4. The second printed circuit board 2 rests by means of spacers 5c and 5d on the first printed circuit board 1. The second connector device 21 is mounted on the second printed circuit board 2. The first connector device 11 is mounted on the first printed circuit board 1, in a manner corresponding to the embodiment shown in FIG. 1, and is guided through the second printed circuit board, and so its upper region directly adjoins the second connector device 21 and both connector devices 11 and 21 are designed together to receive the edge connector 31 of the plug-in board 3. The edge connector 31 ends in a straight lower edge 33.

The housing 4 comprises guide rails 41a and 41b. The module housing 32, in which the plug-in board 3 including its edge connector 31 is arranged, comprises two protrusions 32a and 32b, which are guided in the guide rails 41a and 41b of the housing 4. Both the protrusions 32a and 32b and the guide rails 41a and 41b have coding elements, which ensure that only a plug-in board 3 of the correct type having the correct polarity can be inserted at this place on the housing 4. Thereupon, the guide rails ensure that the edge connector 31 does not tilt during insertion into the connector devices 11 and 21. In the event of such tilting, the edge connector 31 could possibly break.

In the embodiments shown, the edge connector 31 is always the male part of the card edge connector and the connector devices 11 and 21 form the female part of the card edge connector. The invention does, however, function in completely the same manner when the connector devices 11 and 21 are designed as the male part and the edge connectors 31 and 31a as the female part of the card edge connector.

It is also a significant advantage that in the case of the plug connector 11, only the connection of the spring elements (female parts) is extended to the soldering pins in order to achieve the plane equalization between the planes 1a and 2a. As a result of this, the fundamental structure of an edge connector does not change, and so no additional components are necessary and the production of the plug connector 11 can be carried out effectively with known production methods. Only slightly more material is required.

Moreover, further embodiments allow planes of the printed circuit boards 1 and 2, which are inclined toward one another, and angled plug connectors 11.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF REFERENCE NUMERALS

1 First printed circuit board
1a Plane in which the first printed circuit board 1a extends
2 Second printed circuit board
2a Plane in which the second printed circuit board 2 extends
2b The side of the second printed circuit board 2 facing away from the first printed circuit board 1
2c The side of the second plane 2a facing away from the first printed circuit board 1
11 First connector device, connected to the first printed circuit board 1
12 Line from the first connector device 1 to the first printed circuit board 1
21 Second connector device, connected to the second printed circuit board 2
3 Plug-in board
31, 31a Edge connector of the plug-in board 3
32 Module housing of the plug-in board 3
32a, 32b Protrusions of the module housing 32
33 Straight edge (lower edge) of the edge connectors 31, 31a
34 Region between the edge connectors 31 and 31a
4 Housing
41a, 41b Guide rails of the housing 4
5a-5d Spacers

The invention claimed is:
1. An electronic circuit, comprising:
a first printed circuit board, which extends in a first plane;

a second printed circuit board, which extends in a second plane, the second plane being parallel to the first plane and being outside of the first plane;

a first connector device, which is in electrical contact with the first printed circuit board; and a second connector device, which is in electrical contact with the second printed circuit board, wherein the second connector device is arranged on a first side of the second printed circuit board facing away from the first printed circuit board, wherein both the first and second connector devices are configured together to receive an associated plug-in board, wherein both of the first and second connector devices are configured together to electrically contact the associated plug-in board using both the first and second printed circuit boards, wherein the first connector device is arranged, at least in part, on a second side of the second plane facing away from the first printed circuit board.

2. The circuit of claim 1, wherein the first connector device is arranged on the first printed circuit board, and wherein the first connector device is guided through the second printed circuit board.

3. The circuit of claim 1, wherein the first connector device is arranged on the second printed circuit board, and wherein the first connector device electrically contacts the first printed circuit board using a line.

4. The circuit of claim 1, wherein the first connector device is arranged on the first printed circuit board, and wherein the first connector device is guided through the second plane outside of the second printed circuit board.

5. The circuit of claim 1, wherein each of the first and second connector devices is configured to receive at least one edge connector of the plug-in board.

6. The circuit of claim 5, wherein both of the first and second connector devices are configured together to receive one edge connector of the plug-in board.

7. The circuit of claim 6, wherein both of the first and second connector devices include a common stop for a straight edge of one edge connector of the plug-in board.

8. The circuit of claim 1, wherein the plug-in board, including an edge connector, is arranged in a module housing, wherein the module housing is open or is to be opened at a side such that the plug-in board can be inserted into the first and/or second connector devices.

9. The circuit of claim 1, wherein both of the first and second printed circuit boards are arranged in a common housing, wherein the common housing includes a guide configured to guide the associated plug-in board, and/or a module housing of the associated plug-in board, in order to produce an electrical contact between the associated plug-in board and the first and second connector devices.

10. The circuit of claim 1, wherein a first part of the circuit, which is arranged on the first printed circuit board, has a higher nominal voltage in terms of amount at least in a partial region than a second part of the circuit, which is arranged on the second printed circuit board.

11. The circuit of claim 10, wherein the second printed circuit board covers the partial region in a touch-proof manner.

12. The circuit of claim 1, comprising more than one of the second printed circuit board.

13. The circuit of claim 1, comprising more than one of the first connector device.

* * * * *